United States Patent
Cretella et al.

(10) Patent No.: US 7,232,484 B2
(45) Date of Patent: Jun. 19, 2007

(54) METHOD AND APPARATUS FOR DOPING SEMICONDUCTORS

(75) Inventors: Mary C. Cretella, Bedford, MA (US); Richard L. Wallace, Jr., Acton, MA (US)

(73) Assignee: Evergreen Solar Inc., Marlborough, MA (US)

( * ) Notice: Subject to any disclaimer, the term of this patent is extended or adjusted under 35 U.S.C. 154(b) by 0 days.

(21) Appl. No.: 10/997,160

(22) Filed: Nov. 24, 2004

(65) Prior Publication Data

US 2005/0112855 A1  May 26, 2005

Related U.S. Application Data

(63) Continuation of application No. 10/215,391, filed on Aug. 8, 2002.

(60) Provisional application No. 60/311,782, filed on Aug. 10, 2001.

(51) Int. Cl.
C30B 15/20 (2006.01)

(52) U.S. Cl. .............................. 117/19; 117/13; 117/20

(58) Field of Classification Search .................. 117/13, 117/19, 20
See application file for complete search history.

(56) References Cited

U.S. PATENT DOCUMENTS

| | | | |
|---|---|---|---|
| 3,998,659 | A | 12/1976 | Wakefield |
| 4,594,229 | A | 6/1986 | Ciszek et al. |
| 4,627,887 | A | 12/1986 | Sachs |
| 4,661,200 | A | 4/1987 | Sachs |
| 4,689,109 | A | 8/1987 | Sachs |
| 5,147,841 | A | 9/1992 | Wilcoxon |
| 5,223,452 | A | 6/1993 | Knepprath |
| 5,278,097 | A | 1/1994 | Hotchkiss et al. |
| 5,620,904 | A | 4/1997 | Hanoka |
| 5,741,370 | A | 4/1998 | Hanoka |
| 5,762,720 | A | 6/1998 | Hanoka et al. |
| 5,926,727 | A * | 7/1999 | Stevens et al. ............. 438/564 |
| 5,986,203 | A | 11/1999 | Hanoka et al. |
| 6,090,199 | A | 7/2000 | Wallace, Jr. et al. |
| 6,114,046 | A | 9/2000 | Hanoka |
| 6,146,483 | A | 11/2000 | Hanoka et al. |
| 6,187,448 | B1 | 2/2001 | Hanoka et al. |
| 6,200,383 | B1 | 3/2001 | Wallace, Jr. et al. |
| 6,206,996 | B1 | 3/2001 | Hanoka et al. |

(Continued)

FOREIGN PATENT DOCUMENTS

DE 2447204 4/1976

(Continued)

OTHER PUBLICATIONS

Baldwin, R.K.; Pettigrew, K.A.; Ratai, E.; Augustine, M.P.; and Kauzlarich, S.M.; *Chem Commun.*2002, 1882-1823.

(Continued)

*Primary Examiner*—Felisa Hiteshew
(74) *Attorney, Agent, or Firm*—Proskauer Rose LLP (57) ABSTRACT

Semiconductor materials such as silicon particles are doped by mixing the semiconductor material with a solution having a dopan and a solvent. The solvent is removed from the wetted surface of the particles of the semiconductor material, thereby yielding particles that are substantially free from the solvent and are uniformly coated with the dopant.

24 Claims, 6 Drawing Sheets

U.S. PATENT DOCUMENTS

| | | | |
|---|---|---|---|
| 6,217,649 | B1 | 4/2001 | Wallace, Jr. et al. |
| 6,278,053 | B1 | 8/2001 | Hanoka et al. |
| 6,320,116 | B1 | 11/2001 | Hanoka |
| 6,353,042 | B1 | 3/2002 | Hanoka et al. |
| 6,479,316 | B1 | 11/2002 | Hanoka et al. |
| 6,740,158 | B2 * | 5/2004 | Piwczyk ............ 117/18 |

FOREIGN PATENT DOCUMENTS

| | | |
|---|---|---|
| JP | 59182293 | 10/1984 |
| WO | WO 97/24224 | 7/1997 |
| WO | WO 01/14250 | 3/2001 |
| WO | WO 01/38222 | 3/2001 |

OTHER PUBLICATIONS

Baldwin, R.K.; Pettigrew, K.A.; Carno, J.C.; Power, P.P.; Liu, G.; and Kauzlarich, S.M.; *J Am Chem. Soc.*2002, 124, 1150-1151.

Bley, R. A.; Kauzlarich, S. M.; *J. Am. Chem. Soc.*1996, 118, 12461-12462.

Bley, R. A.; Kauzlarich, S. M.; Ed Fendler, J. H.; Ed.; *Nanopart. Nanostruct. Film* Wiley-VCH: Weinheim, Germany, 1998; pp. 101-118.

Dhas, N. A.; Raj, C. P.; Gedanken, A.; *Chem. Mater.*1988, 10, 3278.

Fojtik, A.; Henglein, A.; *Chem. Phys. Lett.*1994, 221, 363-367.

Heath, J., R.; *Science*, 1992, 258, 1131-1133.

Holmes, J. D.; Ziegler, K. J.; Doty, R. C.; Pell, L. E.; Johnston, K. P. Korgel, B. A.; *J. Am. Chem. Soc.*2001, 123, 3742-3748.

Kornowski A.; Giersig, M.; Vogel, R.; Chemseddine, A.; Weller, H.; *Adv. Mater.*1993, 5, 634.

Littau, K. A.; Szajowski, P. J.; Muller, A. J.; Kortan, A. R.; Brus, L. E.; *J. Phys. Chem.*1993, 97, 1224.

Mayeri, D.; Phillips, B.L.; Augustine, M. P.; Kauzlarich, S. M.; *Chem. Mater.*2001, 13, 765.

Sweryda-Krawiec, B.; Cassagneau, T.; and Fendler, J.H.; *J. Phys. Chem. B,*1999, 103, 9524-9529.

Wilcoxon, J. P.; Samara, G. A.; Provencio, P. N.; *Phys. Rev. B* 1999, 60, 2704.

Wilcoxon, J. P.; Samara, G. A.; *Appl. Phys. Lett.* 1999, 74, 3164.

Yang, C.-S.; Bley, R. A.; Kauzlarich, S. M.; Lee, H. W. H.; Delgado, G. R.; *J. Am. Chem. Soc.*1999, 121, 5191.

Yang, C.-S.; Liu, Q.; Kauzlarich, S. M.; Phillips, B.; *Chem. Mater.* 2000, 12, 983.

Zhang, D.; Kolbas, R. M.; Mehta, P.; Singh, A. K.; Lichtenwalner, D. J.; Hsieh, K. Y.; Kingon, A. I. *Mater. Res. Soc. Symp. Proc.,* 1992; 35-40.

PCT/US02/25259 International Search Report Oct. 28, 2002.

* cited by examiner

METHOD AND APPARATUS FOR DOPING SEMICONDUCTORS

RELATED APPLICATIONS

This application is a continuation of U.S. application Ser. No. 10/215,391, filed on Aug. 8, 2002, which claims the benefit of the filing date of U.S. Provisional Patent Application Ser. No. 60/311,782, filed on Aug. 10, 2001, entitled "Method and Apparatus for Doping Semiconductors" by Cretella et al. The entire disclosures of these applications are incorporated herein by reference.

TECHNICAL FIELD

The invention generally relates to semiconductors and crystal growth. Particularly, the invention relates to techniques for doping semiconductors for ribbon crystal growth.

BACKGROUND OF THE INVENTION

In order to produce lower cost solar cells and hence expand large-scale electrical applications of solar electricity, it is important to have lower cost substrate materials for making the solar cell. One preferred method for achieving this in the case of crystalline silicon is through the growth of crystalline silicon ribbon in a continuous process. See, e.g., U.S. Pat. Nos. 4,594,229; 4,627,887; 4,661,200; 4,689,109; 6,090,199; 6,200,383; and 6,217,649.

In these patents, continuous silicon ribbon growth is carried out by introducing two high temperature material strings up through a crucible that includes a shallow layer of molten silicon. The strings serve to stabilize the edges of the growing ribbon and the molten silicon freezes into a solid ribbon just above the molten layer. The molten layer that forms between the strings and the growing ribbon is defined by the meniscus of the molten silicon.

U.S. Pat. Nos. 6,090,199 and 6,217,649 describe a method and apparatus for continuous replenishment of the feedstock material in a continuous silicon ribbon. In order to make a useful electrical device, it is necessary, in the case for a solar cell to dope the feedstock material so as to eventually form a p-n junction. In a typical method of doping silicon, a small material so as to eventually form a p-n junction. In a typical method of doping silicon, a small quantity of either the dopant itself or a concentrated form of the dopant in silicon is added to a silicon melt. The addition of the dopant in this manner in batch processes is not readily compatible with continuous ribbon growth techniques such as that discussed above. In connection with these patents, it is necessary to have silicon feedstock material that is composed of small silicon particles.

SUMMARY OF THE INVENTION

Techniques for doping semiconductors in general and silicon in particular have been developed. These techniques are particularly relevant to the growth of silicon ribbon for low-cost solar cell manufacturing. The present invention describes a method whereby each semiconductor particle (or substantially each particle) in the feedstock can be, in effect, separately doped. Using the method and apparatus of the present invention in combination with that of U.S. Pat. Nos. 6,090,199; 6,200,383, and 6,217,649, which relate to continuous melt replenishment, a simplified and low-cost method for doping silicon for a continuous ribbon growth process can be achieved.

In one aspect, the invention features a method for doping a semiconductor material such as silicon. A doping solution that includes a dopant and a solvent is contacted with particles of a semiconductor material to uniformly wet the surface of the particles with the doping solution. The solvent is then removed from the wetted surface of the particles of the semiconductor material, thereby yielding particles that are substantially free from the solvent and are uniformly coated with the dopant.

In another aspect, the invention features an apparatus for doping a semiconductor material. The apparatus includes a mixing chamber for mixing particles of the semiconductor material and a doping solution. The mixing chamber has a vapor outlet that allows vapor to exit the mixing chamber. In addition, the apparatus includes a heater to provide controlled heating of the mixing chamber and an agitation mechanism allowing agitation of the content of the mixing chamber.

In yet another aspect, the invention features a method for doping silicon. A doping solution including at least one dopant and at least one low boiling solvent is mixed with silicon particles. The mixing allows the doping solution to uniformly wet the surface of the silicon particles. The at least one low boiling solvent is removed from the surface of the silicon by heating the silicon particles under reduced pressure. The resulting silicon particles are substantially free from the at least one low boiling solvent and are uniformly coated with the at least one dopant. The silicon is molted to form a homogeneous mixture of silicon and the at least one dopant.

DESCRIPTION

The invention utilizes a so-called "liquid dopant," which is a doping solution containing the desired dopant along with one or more solvents (e.g., organic solvents).

In one aspect, the invention features a method for doping a semiconductor material. A doping solution having a dopant and a solvent is contacted with particles of a semiconductor material to uniformly wet the surface of the particles with the doping solution. The solvent is then removed from the wetted surface of the particles of the semiconductor material to yield particles that are substantially free from the solvent and are uniformly coated with the dopant. As used herein, "substantially free from solvent" means a solvent concentration of less than about 2%. Preferably, the solvent concentration is less than about 1%. More preferably, the solvent concentration is less than about 0.5%. Drying is considered complete by qualitative assessment; i.e., when the product color changes from the dark pewter of the wet stock to the more silvery sheen of the undoped silicon; when the product flows freely; and/or when there is little or no residual odor.

Figure 1:
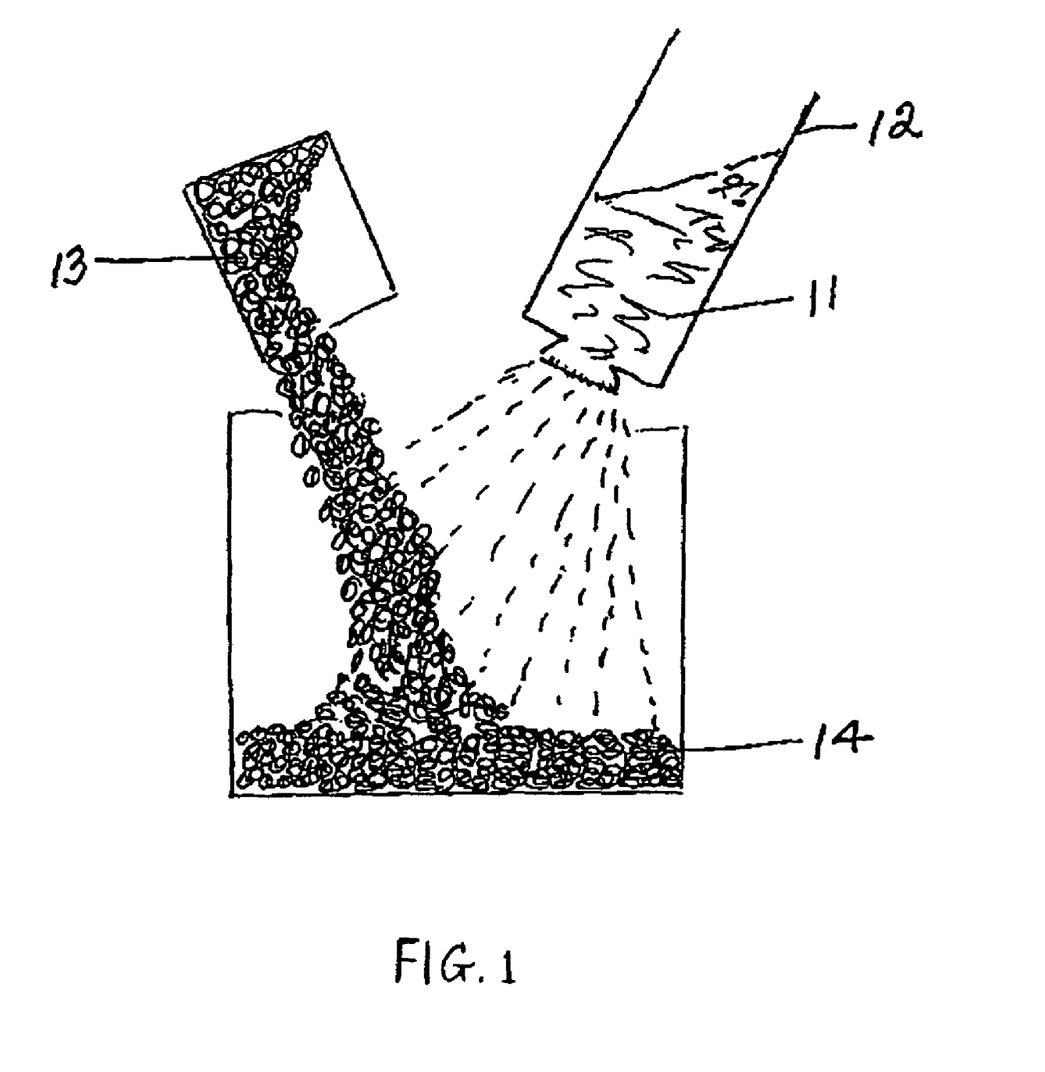
FIG. 1 schematically illustrates one embodiment of applying a doping solution to semiconductor feedstock particles.
Figure 2:
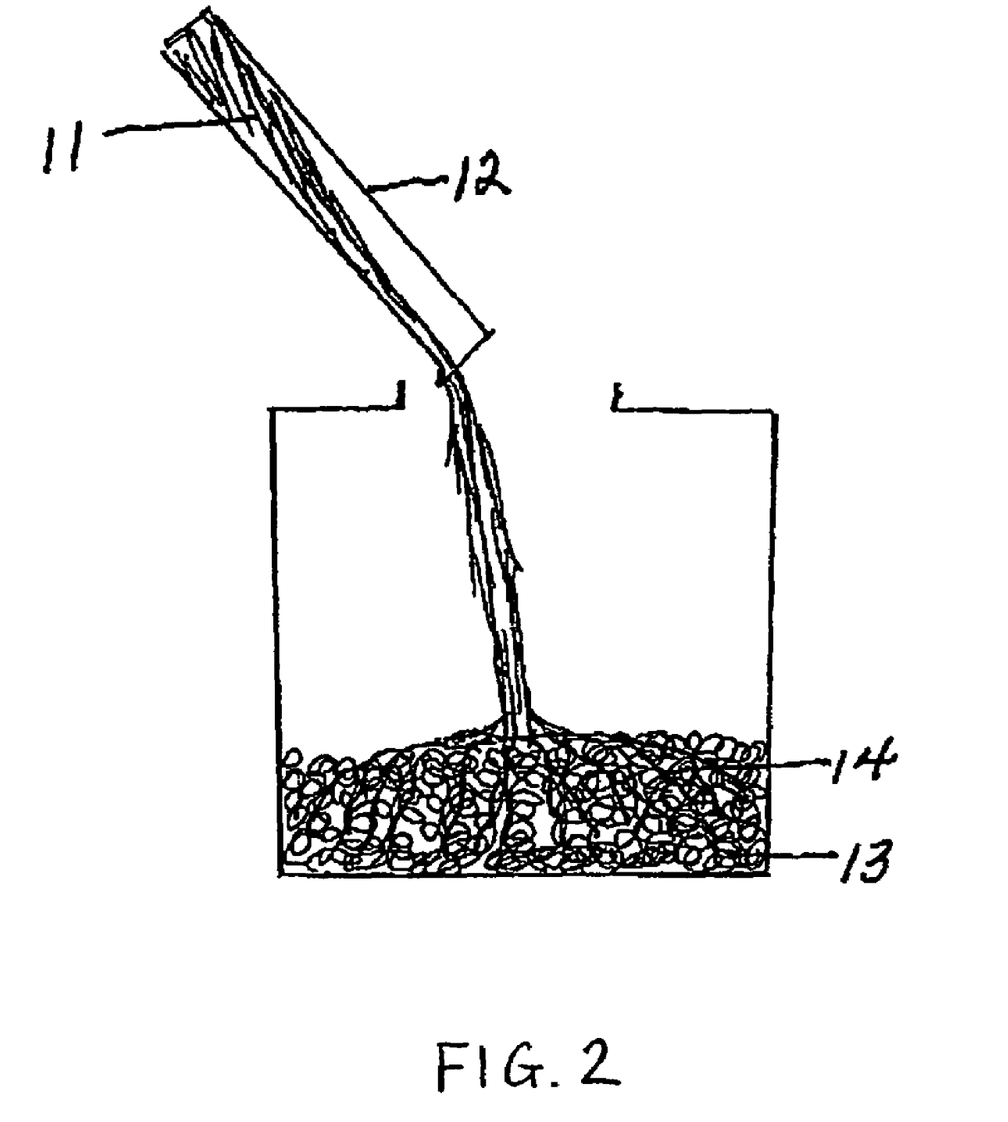
FIG. 2 schematically illustrates one embodiment of applying a doping solution to semiconductor feedstock particles.

Referring to FIGS. 1 and 2, a doping solution 11 containing the desired dopant material exiting a dispensing container 12 is applied to particles of the semiconductor material to be doped (e.g., the feedstock material 13) so as to yield a feedstock material 14 that is coated with the doping solution.

Typically, mixing and/or agitation of the feedstock material are needed to ensure that every piece of the semiconductor feedstock material is uniformly coated with the doping solution.

Figure 3:
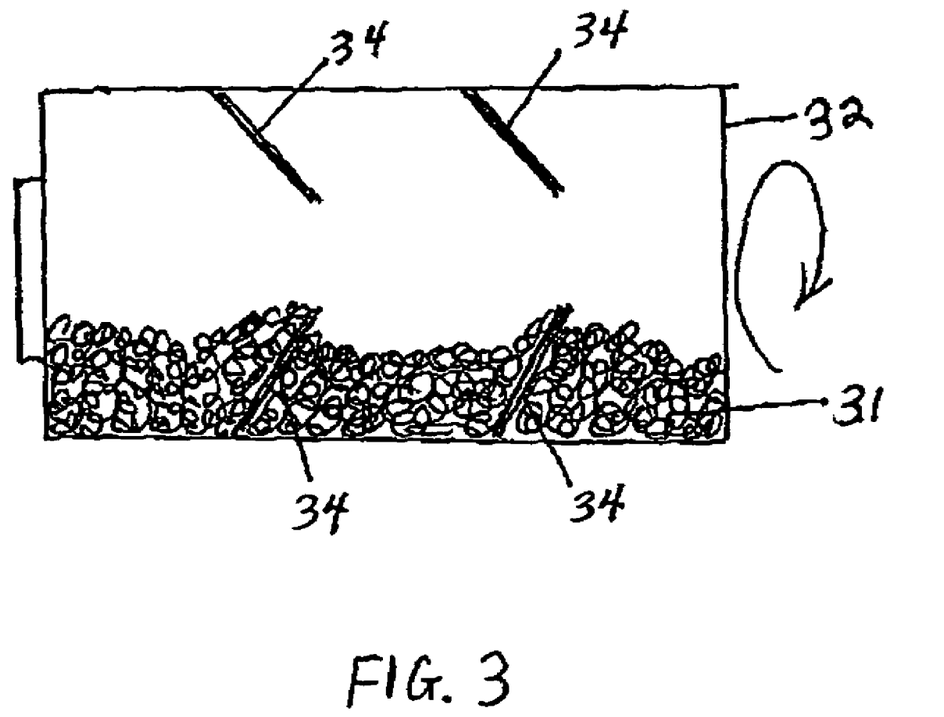
FIG. 3 schematically illustrates one embodiment of the mixing chamber.

Referring to FIG. 3, the mixing step can be carried out in a rotating cylindrical mixing chamber 32 powered by a motor (not shown). To facilitate the mixing, baffles 34 can be arranged on the inside wall of the mixing chamber to increase tumbling motion of the feedstock 31 to ensure uniformity. Heat may be applied during the mixing step to facilitate uniform mixing of the doping solution with the semiconductor feedstock material.

When the semiconductor material is uniformly coated with the doping solution, heat is typically applied to cause the solvent to evaporate, leaving behind a coat of the dopant on the surface of the semiconductor feedstock. The wetted semiconductor feedstock is thus typically dried by heating the wetted feedstock and pulling and/or blowing away the vaporized solvent with the aid of a vacuum pump and/or a fan.

Figure 4:
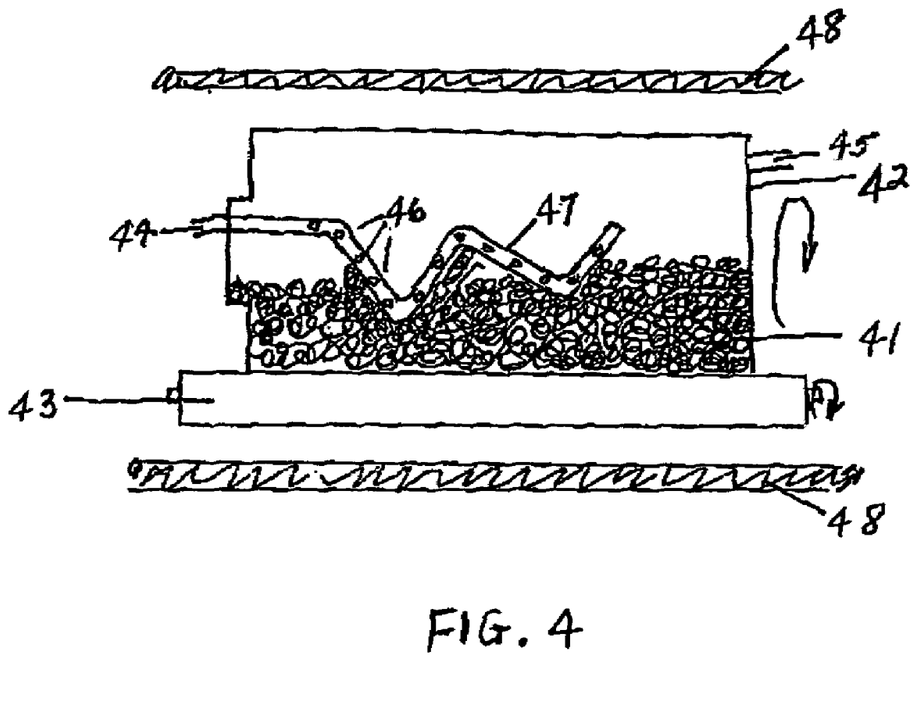
FIG. 4 schematically illustrates one embodiment of the mixing, the heating and the solvent removal steps.

Referring to FIG. 4, the wetted feedstock material 41 is placed in a vessel 42 that both mixes and dries the wetted feedstock material with the aid of a rotating bed 43. A gas inlet 44 and a gas outlet 45 are provided to aid in the solvent removal. The gas inlet tube 47 is configured to provide both gas dispersion from holes 46 and to provide agitation of the feedstock when the vessel rotates. The vessel 42 is set in a heat source such as an oven or is wrapped with an electrical heating jacket 48 to heat and fix the dopant to the surface of the feedstock.

The feedstock may also be dried by applying a vacuum or by blow-drying with air, with or without heating the feedstock at the same time. This is particularly useful when the semiconductor and/or the dopant is temperature sensitive and unstable. In this regard, an inert environment such as under nitrogen or argon can also be employed to minimize exposure to oxygen.

Since all particle sizes are coated uniformly, size segregation causes no inconsistency in doping level of the silicon melt. Dried feedstock material can then be handled as would undoped feedstock material and can be used in an automatic feed system as is exemplified in U.S. Pat. Nos. 6,090,199; 6,200,383; and 6,217,649. In many current doping approaches, an amount of heavily doped silicon particles are added to the undoped silicon to provide the necessary level of dopant. Typically these particles are at the low end of the size range and care must be taken to limit the amount of replenishment material in the feed reservoir because of size segregation. Without this limitation segregation effects can cause the variation in bulk resistivity of the crystallized material to be greater than 1 ohm-cm. With the present invention, the reservoir can be filled to capacity and the resultant bulk resistivity of the crystallized material is held to less than 0.5 ohm-cm variation.

Semiconductor materials that can be doped (or further doped) using the methods of the invention include silicon, germanium, tin, diamond, gallium arsenide, gallium phosphide, indium arsenide, gallium antimonide, indium antimonide, indium phosphide, gallium arsenide antimonide, gallium nitride, as well as ternary compounds. Dopants that can be used in the methods of the invention include any materials that can be added to the semiconductor to modify its properties and characteristics including any p-type or n-type dopants. Exemplary p-type dopants for group IV semiconductor materials include boron, aluminum, gallium, indium, and thallium. Exemplary n-type dopants for group IV semiconductors include phosphorus, arsenic, antimony, and bismuth. For compound semiconductor materials other elements or combination of elements may be employed for doping from group IV or other groups of the periodic table. Two or more dopants can be used at the same time using the methods of the invention.

Some dopants, such as gallium, arsenic, antimony and others have low segregation coefficient, which is the ratio of dopant concentration in crystal to concentration in melt from which the crystal grows. Gallium has a segregation coefficient of about $8 \times 10^{-3}$. Ordinary doping techniques are cumbersome if used to supply doped silicon for continuous melt replenishment and are also difficult to achieve and maintain uniform doping levels. Once the melt has been established to accommodate the appropriate concentration of the dopant, the amount to be added as replenishment is very small and control of such small amounts cannot be readily or reliably achieved by ordinary doping techniques. The techniques described herein allow the replenishing silicon particles to be accurately doped with this type of dopants (i.e., dopants such as gallium) and compensate for segregation effects.

In another embodiment, an aqueous solution of a dopant-containing polymer that contains a group III element (e.g., aluminum, boron or gallium) or a group V element (e.g., phosphorous, antimony or arsenic) at a specific concentration is diluted with water or a miscible alcohol to the experimentally determined level and heat-treated to achieve target resistivity.

A dopant is typically diluted in a solvent, usually a low boiling organic solvent such as an alcohol. Exemplary alcohols useful as solvent in preparing a doping solution include methyl alcohol, ethyl alcohol, propyl alcohol, and isopropyl alcohol. Two or more solvents may be used simultaneously in making a doping solution.

The dopant concentration in the doping solution is predetermined according to the desired doping level. The target doping level of $6 \times 10^{14}$ to $2 \times 10^{17}$ can be varied by changing the dopant concentration in the doping solution, the amount of doping solution used, and/or the further dilution of the doped feedstock with undoped feedstock. For a given set of treatment conditions, the utilization of the dopant solution is determined experimentally for each dopant and defined by the target bulk resistivity of the crystallized material. For example, a more concentrated doping solution can be made and diluted to the appropriate level before use. Alternatively, a portion of the feedstock can be doped, and the doped feedstock is mixed with undoped feedstock to achieve the desired doping level. This later approach mimics the usual procedure of adding concentrated pellets to the silicon melt.

Depending on factors including the semiconductor to be doped, the dopant, the solvent used, and the amount of solvent to be removed, the wetted feedstock material may be heated to various temperatures to facilitate removal of the solvent from the surface of the feedstock. In one embodiment, the wetted feedstock is heated to a temperature range of 20° C.–120° C. In other embodiments, the wetted feedstock is heated to a temperature between 30° C.–110° C., between 45° C.–100° C., or between 60° C.–90° C.

In another embodiment, the invention features a method for doping silicon. A doping solution including at least one dopant and at least one low boiling solvent is mixed with silicon particles (i.e., the feedstock). The mixing allows the doping solution to uniformly wet the surface of the particles. The at least one low boiling solvent is removed from the surface of the particles by heating the wetted feedstock under reduced pressure. The resulting silicon particles are substantially free from the at least one low boiling solvent and are uniformly coated with the at least one dopant. The particles are melted to form a homogeneous mixture of silicon and the at least one dopant.

In one example, a doping solution containing boron at 0.008% by weight and a low boiling solvent, ethyl alcohol, is added to silicon feedstock pellets in an amount sufficient to achieve a desired doping level, such as 3 to $5 \times 10^{15}$ atoms/cm$^3$, which is typical for a p-type material with 1–5 ohm-cm. In determining the amount of doping solution to use, small batch trials can be performed to determine the level of boron utilization. The amount of doping is determined experimentally for the end concentration desired recognizing that the efficiency of coverage from the doping solution is less than 100 percent since losses of the doping element occur during the overall treatment process. Utilization of the available boron in the doping solution can vary from 10 to 45% determined by the heat treatment and the dilutions employed. That is, at the higher temperatures and/or at a rapid rate of heating a greater amount of the dopant material may be volatilized with the solvent. Similarly, at higher concentrations of dopant in solvent, the utilization may or may not be improved depending on whether the heat treatment necessary to achieve attachment of the dopant and drying of the silicon can be balanced against additional loss of dopant. The undoped silicon feedstock material with the added doping solution is agitated briefly at room temperature in a chemically inert chamber, under a flow of argon or nitrogen, to uniformly wet the silicon. The temperature is then raised to about 100° C., while agitation continues, in order to affix the doping element onto the silicon surface and to drive off the excess alcohol vehicle. The material is cooled slowly while continuing the inert atmosphere flow until brought to room temperature at which time drying is complete. Temperature of processing can vary from about 30° C. to about 110° C. depending on the dopant concentration, the solvent and the time parameters chosen. Total process time is typically determined by the mass of silicon feedstock to be treated and can range from less than an hour for a few kilograms of silicon feedstock to several hours for a scale of hundreds of kilograms.

The mixing and drying steps can be performed in a single, continuous step, allowing fast and economical processing. For example, a doping solution containing boron and a low boiling point alcohol can be mixed and dried in a single vessel that serves as both the mixing chamber and the drying chamber.

The semiconductor feedstock material can have a variety of sizes and shapes. For example, the feedstock can be spherically shaped particles having diameters up to several millimeters. Such spherically shaped silicon particles can be made by thermal decomposition of silane in a fluidized bed reactor. The feedstock can also be pellets or pastilles. The feedstock material can also be angular, irregularly shaped silicon particles having various sizes.

The techniques of the invention can be combined with a crystal growth system that utilizes semiconductor feedstocks as source material. In one embodiment, the method of doping a semiconductor material is utilized in a string stabilized crystal growth system. For example, silicon particles doped with at least one dopant according to the method of the present invention are fed into a crucible having a melt of silicon therein. A silicon crystal ribbon is grown from the melt of silicon with string stabilization being employed at the edges of the ribbon. The at least one dopant is uniformly distributed in the grown silicon crystal ribbon.

In another aspect, the invention features an apparatus for doping a semiconductor material. The apparatus includes a mixing chamber that has a vapor outlet allowing vapor to exit the mixing chamber; a heating mechanism that provides controlled heating of the mixing chamber; and an agitation mechanism allowing agitation of the content of the mixing chamber.

In some embodiments, the apparatus further includes a vacuum unit that facilitates removal of vaporized solvent from the feedstock. The apparatus may further include a motor which rotates the mixing chamber when mixing the doping solution with the feedstock and when drying the feedstock. The apparatus can be designed to fit various production scales up to hundreds of kilograms. Also, the apparatus may include a gas inlet and outlet system for removal of solvent and control of the environment of the mixing chamber.

Figure 5:
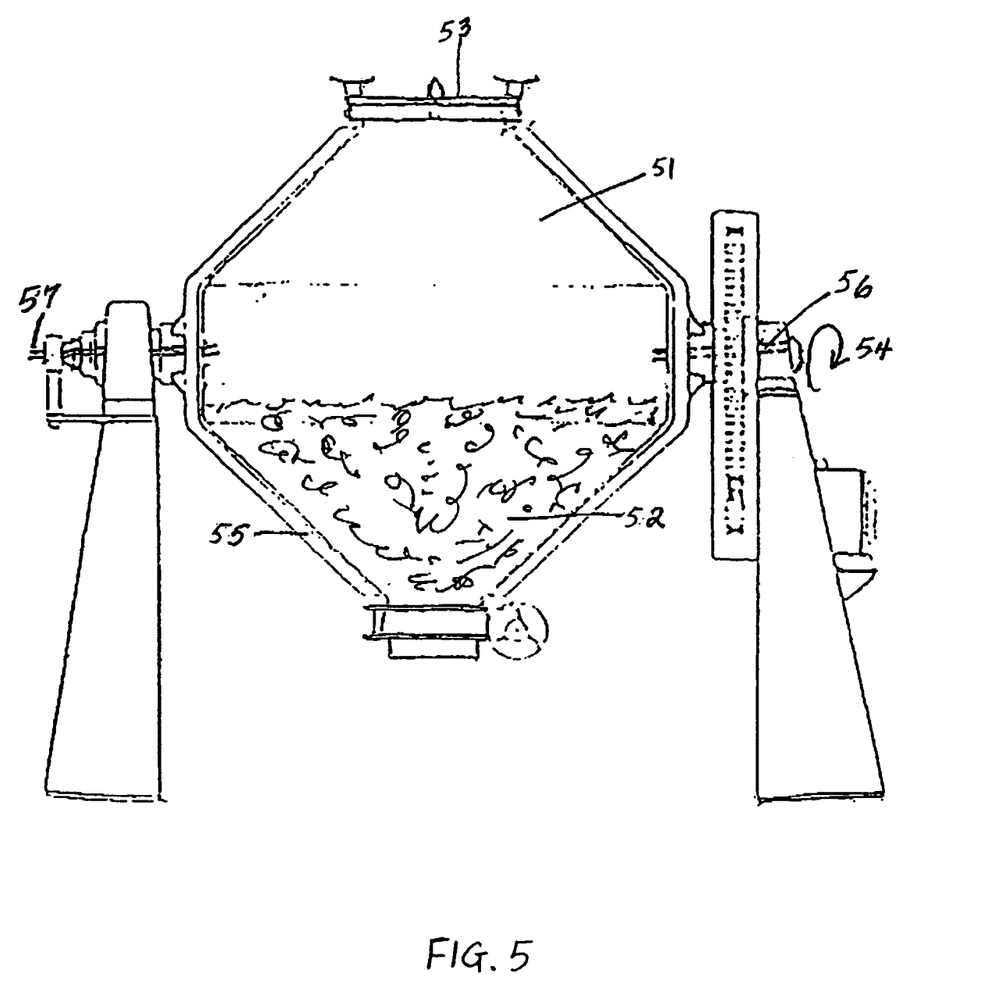
FIG. 5 schematically illustrates one embodiment of a doping apparatus for large-scale production.
Figure 6:
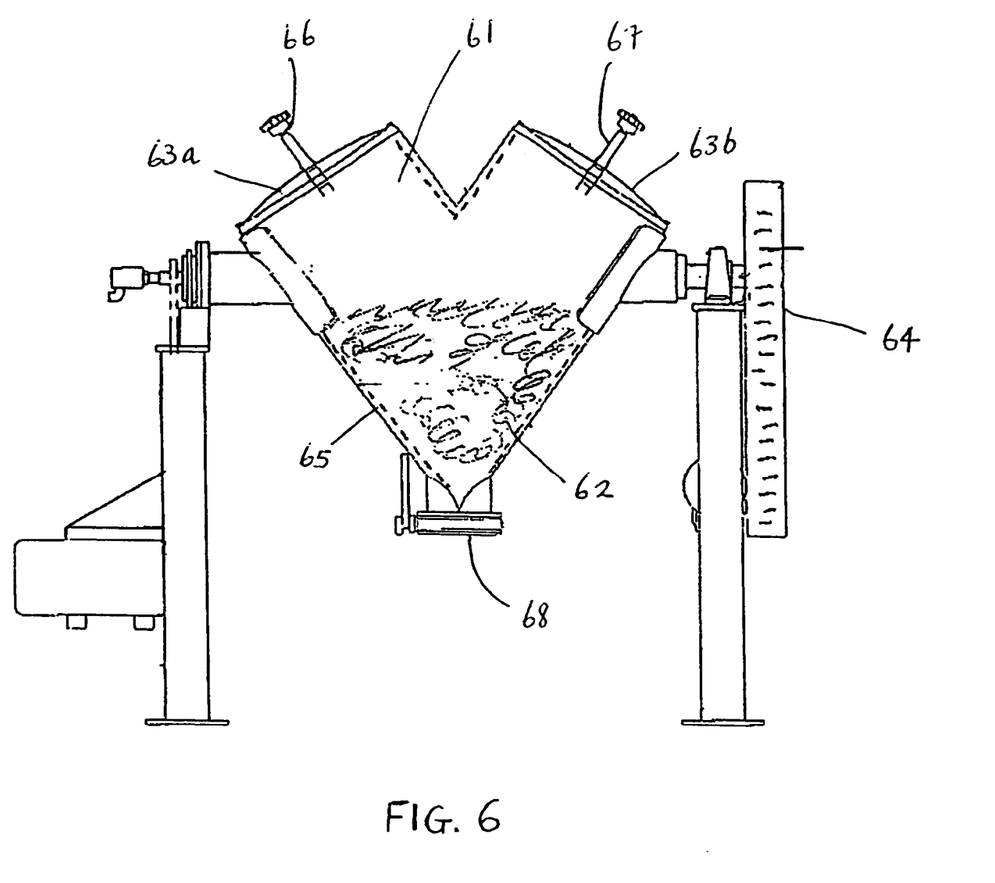
FIG. 6 schematically illustrates one embodiment of a doping apparatus for large-scale production.

FIGS. 5 and 6 schematically illustrate large scale doping of semiconductor materials. Systems such as that illustrated in FIGS. 5 and 6 can treat up to 400 Kg of feedstock within 4 to 5 hours.

In FIG. 5, a diamond-shaped vessel 51 is used both to mix and to dry the feedstock material 52. The semiconductor feedstock 52 is added in the vessel 51 and a required amount of doping solution is added through the port 53. The components are mixed by rotation of the vessel 51 with a motor 54. Heating is provided through a heated jacket 55. A gas flow is introduced through opening 56 and pulled out of the vessel by a vacuum through opening 57.

In FIG. 6, a V-shaped vessel 61 is used both to mix and to dry the feedstock material 62. The semiconductor feedstock 62 is added in the vessel 61 and a required amount of doping solution is added through port 63a or port 63b. The components are mixed by rotation of the vessel 61 with a motor 64. Heating is provided through a heated jacket 65. A gas flow is introduced through opening 66 and pulled out of the vessel 61 by a vacuum through opening 67. Processed feedstock exits the vessel through port 68.

Some commercial mixing and blending units commonly used in the pharmaceutical industry can potentially be adapted for a large range of scale for production needs. Standard ancillary equipment for loading, treating, vacuum, heating, cooling and solvent recovery can be incorporated, as appropriate.

Each of the patent and patent application documents disclosed hereinabove is incorporated by reference herein in its entirety.

Variations, modifications, and other implementations of what is described herein will occur to those of ordinary skill in the art without departing from the spirit and the scope of the invention. Accordingly, the invention is not to be limited only to the preceding illustrative description.

The invention claimed is:

1. A method for doping a semiconductor material, the method comprising:

mixing particles of a semiconductor material with a doping solution comprising a dopant and a solvent to form a mixture; and heating the mixture to vaporize the solvent, thereby yielding particles of the semiconductor material which are substantially free from solvent and uniformly coated with the dopant.

2. The method of claim 1 wherein the mixture is heated to a temperature of between about 30° C. to about 110° C.

3. The method of claim 1 wherein the particles of the semiconductor material are silicon particles.

4. The method of claim 3 wherein the silicon particles are in the form of pellets.

5. The method of claim 3 wherein the silicon particles are in the form of angular irregularly shaped particles having sizes up to 1 cm in diameter.

6. The method of claim 3 wherein the silicon particles are in the form of spherical particles.

7. The method of claim 1 wherein the dopant is one or more of a p-type dopant.

8. The method of claim 1 wherein the dopant is one or more of a Group III element.

9. The method of claim 1 wherein the dopant is one or more of a n-type dopant.

10. The method of claim 1 wherein the dopant is one or more of a Group V element.

11. The method of claim 1 wherein the solvent has a boiling temperature between about 40° C. and about 110° C.

12. A method for doping a semiconductor material for use in adding a dopant to a semiconductor melt, the method comprising the steps of:
   a. applying a doping solution comprising the dopant and a solvent to particles of the semiconductor material to yield a feedstock material coated with the doping solution;
   b. mixing the feedstock material to uniformly coat the particles of the semiconductor material with the doping solution; and
   c. drying the coated feedstock material to evaporate the solvent, thereby leaving a coat of dopant on the surface of the feedstock material.

13. The method of claim 12 further comprising the step of:
   d. melting the dried coated feedstock material to form a mixture of semiconductor material and the dopant.

14. The method of claim 13 wherein the mixture comprises a concentration of dopant sufficient to provide the desired doping level; 0.01 to 20 ohm-cm n-type or p-type material.

15. The method of claim 13 further comprising the step of:
   e. feeding the melted mixture into a crucible to grow a crystal ribbon.

16. The method of claim 12 wherein step c comprises applying heat to the coated feedstock material.

17. The method of claim 12 wherein step c comprises applying a vacuum to the coated feedstock material.

18. The method of claim 12 wherein step c comprises blow-drying the feedstock material.

19. The method of claim 12 wherein the particles of the semiconductor material are silicon particles.

20. The method of claim 12 wherein the dopant is one or more of a p-type dopant.

21. The method of claim 12 wherein the dopant is one or more of a Group III element.

22. The method of claim 12 wherein the dopant is one or more of a n-type dopant.

23. The method of claim 12 wherein the dopant is one or more of a Group V element.

24. The method of claim 12 wherein the solvent is a low boiling point alcohol.

* * * * *